(12) United States Patent
Wells et al.

(10) Patent No.: US 7,454,675 B1
(45) Date of Patent: Nov. 18, 2008

(54) TESTING OF A PROGRAMMABLE DEVICE

(75) Inventors: Robert W. Wells, Cupertino, CA (US); Shekhar Bapat, Cupertino, CA (US); Tassanee Payakapan, San Jose, CA (US); Shahin Toutounchi, Pleasanton, CA (US)

(73) Assignee: Xilinx, Inc., San Jose, CA (US)

( * ) Notice: Subject to any disclaimer, the term of this patent is extended or adjusted under 35 U.S.C. 154(b) by 214 days.

(21) Appl. No.: 10/970,936

(22) Filed: Oct. 22, 2004

(51) Int. Cl.
*G01R 31/28* (2006.01)
(52) U.S. Cl. .................................. 714/726; 714/731
(58) Field of Classification Search .................. 714/725, 714/726
See application file for complete search history.

(56) References Cited

U.S. PATENT DOCUMENTS

| | | | | |
|---|---|---|---|---|
| 5,488,612 | A * | 1/1996 | Heybruck | 714/725 |
| 5,867,507 | A * | 2/1999 | Beebe et al. | 714/726 |
| 6,003,150 | A * | 12/1999 | Stroud et al. | 714/725 |
| 6,038,192 | A * | 3/2000 | Clinton et al. | 365/230.03 |
| 6,084,930 | A * | 7/2000 | Dinteman | 375/354 |
| 6,694,464 | B1 * | 2/2004 | Quayle et al. | 714/725 |
| 6,751,762 | B2 * | 6/2004 | Antonischki | 714/718 |
| 6,874,107 | B2 * | 3/2005 | Lesea | 714/725 |

OTHER PUBLICATIONS

"An efficient reconfigurable architecture and implementation of edge detection algorithm using Handle-C" by Rao et al. This paper appears in: Information Technology: Coding and Computing, 2004. Proceedings. ITCC 2004. International Conference on Publication Date: Apr. 5-7, 2004 vol. 2, On pp. 843-847 vol. 2 ISBN: 0-7695-2108-8.*

"Testing FPGA based reconfigurable system within run time applications" by Doumar et al. This paper appears in: The 13th International Conference on Microelectronics, 2001. ICM 2001 Proceedings. Publication Date: Oct. 29-31, 2001 On pp. 234-236 ISBN: 0-7803-7522-X INSPEC Accession No. 7360718.*

* cited by examiner

*Primary Examiner*—Cynthia Britt
(74) *Attorney, Agent, or Firm*—Timothy W. Markison; Michael T. Wallace

(57) ABSTRACT

A method of testing a programmable device begins by programming at least a portion of the programmable device in accordance with at least a portion of an application to produce a programmed circuit, wherein the programmed circuit includes an input sequential element and an output sequential element. The method continues by providing a test input to the programmed circuit. The method continues by triggering the input sequential element to temporarily store the test input based on a first edge of the test clock. The method continues by triggering the output sequential element to temporarily store a test output of the programmed circuit based on a second edge of the test clock. The method continues by capturing the test output of the programmed circuit in accordance with the second edge of the test clock.

16 Claims, 8 Drawing Sheets example logic module test

FPGA under test

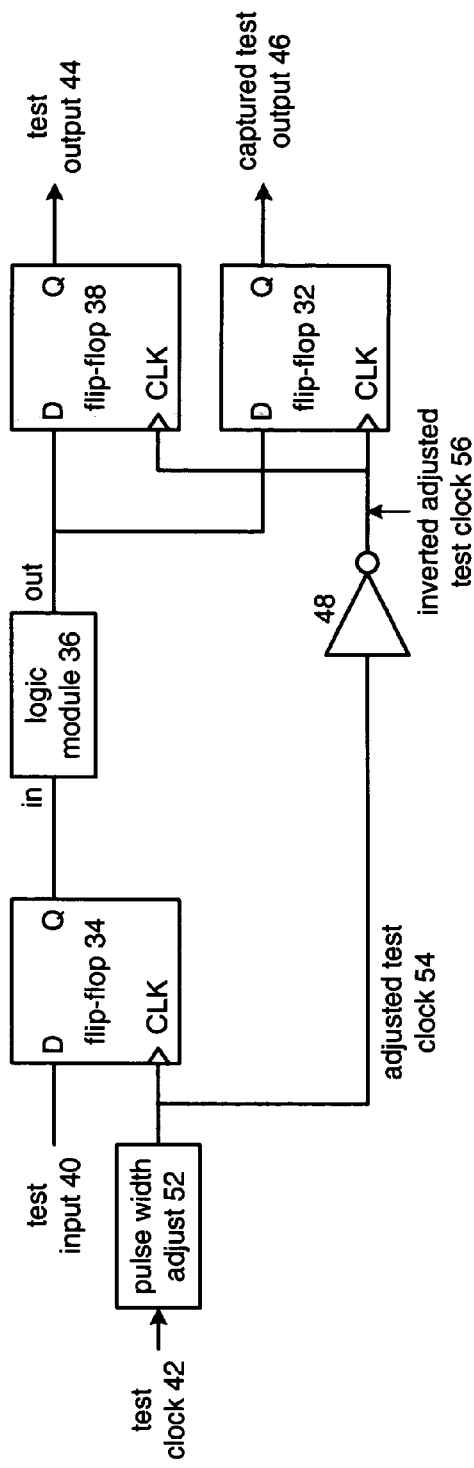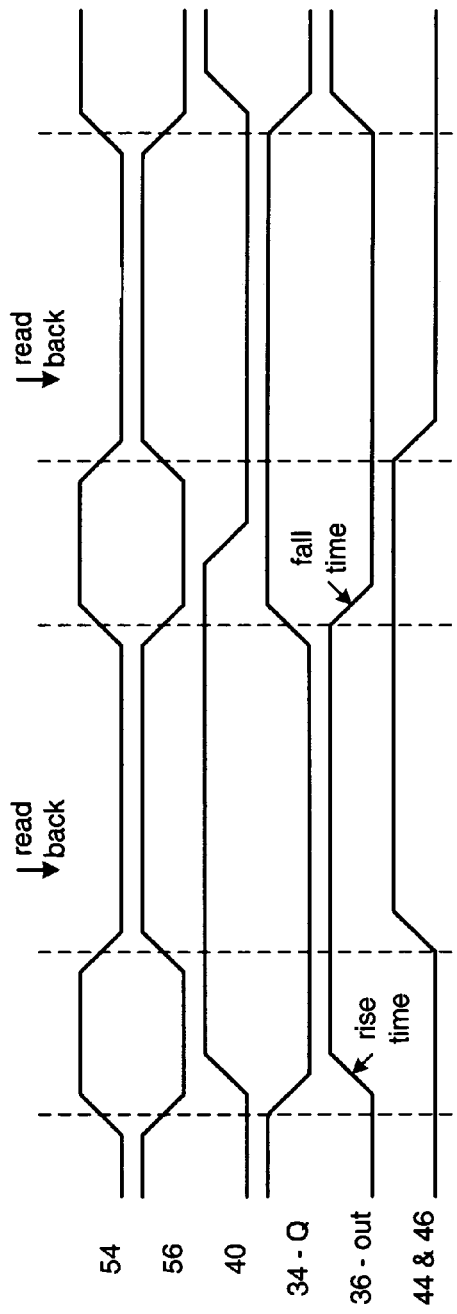
FIG. 4
example logic module test

FPGA under test

FPGA under test

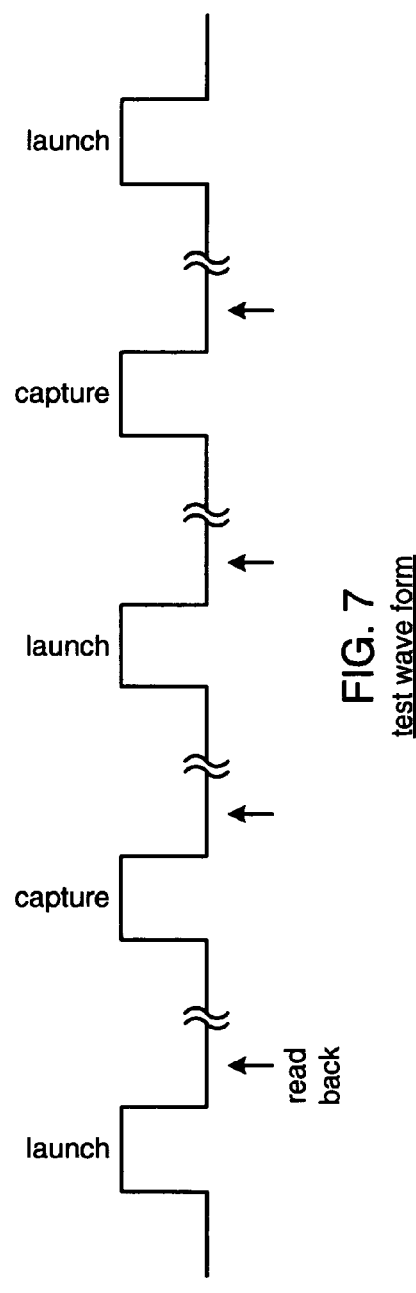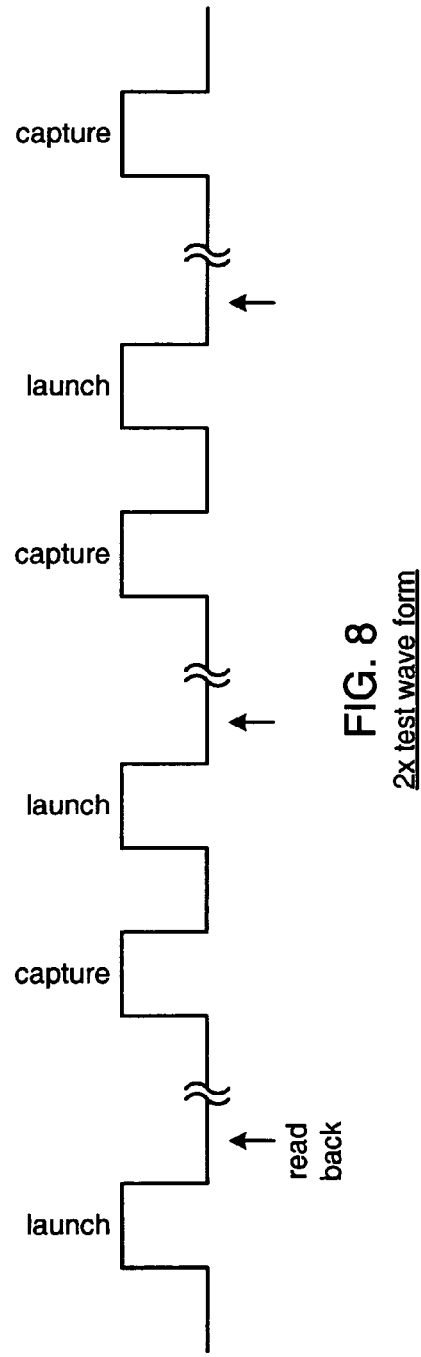
FIG. 7
test wave form
FIG. 8
2x test wave form

TESTING OF A PROGRAMMABLE DEVICE

BACKGROUND OF THE INVENTION

1. Technical Field of the Invention

This invention relates generally to programmable logic devices and more particularly to at-speed testing of programmable logic devices.

2. Description of Related Art

As is known, programmable devices are a class of general-purpose integrated circuits that can be configured for a wide variety of applications. Such programmable devices have two basic versions; mask programmable devices, which are programmed only by a manufacture, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PGA).

Field programmable gate arrays (FPGA) have become very popular for telecommunication applications, Internet applications, switching applications, routing applications, and a variety of other end user applications. In general, an FPGA includes programmable logic fabric (containing programmable logic gates and programmable interconnects) and programmable input/output blocks. The programmable input/output blocks are fabricated on a substrate supporting the FPGA and are coupled to the pins of the integrated circuit, allowing users to access the programmable logic fabric. The programmable logic fabric may be programmed to perform a wide variety of functions corresponding to particular end user applications. The programmable logic fabric may be implemented in a variety of ways. For example, the programmable logic fabric may be implemented in a symmetric array configuration, a row-based configuration, a column-based configuration, a sea-of-gates configuration, or a hierarchical programmable logic device configuration.

As is further known, field programmable gate arrays allow end users the flexibility of implementing custom integrated circuits while avoiding the initial cost, time delay and inherent risk of application specific integrated circuits (ASIC). While FPGAs have these advantages, there are some disadvantages. For instance, an FPGA programmed to perform a similar function as implemented in an ASIC can require more die area than the ASIC. Further, performing at-speed testing of an FPGA can be difficult.

In particular, as processed technology shrink to 130 and 90 nanometers, speed related defects become more and more of an issue. Resistive via or resistive bridge defects between two neighboring metal lines can cause a transition fault. A transition fault refers to a gate or a path that fails to meet timing requirements due to a manufacturing defect. Unlike a stuck-at fault, which can be detected by appropriate application of vectors and observation of outputs, transition faults have an added requirement of at-speed testing.

The transition fault model is a modified version of a stuck-at fault model in which there is an additional restriction of speed. A transition fault testing aims to catch faults related to slow-to-rise and slow-to-fall transitions. One possible cause for slow-to-rise and slow-to-fall transitions are bridging falls that slow down the transition time of a gate, but eventually produce the correct value. These types of faults are not detected with conventional low speed tests.

In addition, many such transition faults are candidates for future reliability failures. Because a part that starts out with marginal or timing-related defects may turn into hard failures in the field. Thus, testing for speed related defects becomes increasingly important.

One obvious way to catch speed related defects is to run the conventional tests at high speed. High speed tests of integrated circuits have a variety of practical problems associated with them. The test hardware has to reliably apply and sample the vectors at very high speeds. This tends to increase the cost of the tester. Also, high speed applications of vectors results in high current consumption and the device under test will heat up. It is not very practical to employ sophisticated heat syncs in the test environment.

The problems with high speed tests are well recognized by the industry. In the application specific integrated circuit (ASIC) world, there are several approaches to at-speed testing. In one approach, at-speed testing utilizes built-in circuitry that internally applies the vectors and compacts the output before presenting it to an outside tester. In this way, the tester-device interface will be a slow one, whereas the device under test is tested at high speeds. This solution is generally referred to as built-in-self-test (BIST), but tends to be difficult to implement and requires additional silicon area. Further, BIST testing is not deterministic. Since the BIST technique utilizes pseudo random test vectors which do not target specific faults.

Another approach is to use automated test pattern generation (ATPG) and the scan test infrastructure to deliver a series of closely spaced pulses to test for transition faults. The circuit under test goes through an at-speed transition by use of launch and capture cells. The closely spaced pulses create the at-speed test environment. The average power consumption is kept low because closely spaced pulses are sparse. This technique is not being employed for FPGA'S.

Further, in current testing of application specific FPGA's, there are capture cells associated with every flip-flop in the FPGA that can be read back and the value read out during the test. Read back, however, is a slow process that takes an amount of time equivalent to numerous clock cycles. When read back occurs, the next tester clock occurs much later than what is required for at-speed testing. Typically, a tester imposes constraints on the speed of the clocks applied to the circuit and, within a tester, it is difficult to create a narrow width pulse clock.

Therefore, a need exists for a method and/or apparatus of at-speed testing of programmable logic devices, including FPGAs.

BRIEF SUMMARY OF THE INVENTION

The testing of a programmable device of the present invention substantially meets these needs and others. In one embodiment, a method of testing a programmable device begins by programming at least a portion of the programmable device in accordance with at least a portion of an application to produce a programmed circuit, wherein the programmed circuit includes an input sequential element and an output sequential element. The method continues by providing a test input to the programmed circuit. The method continues by triggering the input sequential element to temporarily store the test input based on a first edge of the test clock. The method continues by triggering the output sequential element to temporarily store a test output of the programmed circuit based on a second edge of the test clock. The method continues by capturing the test output of the programmed circuit in accordance with the second edge of the test clock.

In another embodiment, a method for testing a programmable device begins by providing a test pattern to a logic module of the programmable device for a plurality of clock pulses of a test clock. The method continues by, for each clock pulse of the plurality of clock pulses, capturing an output of the logic module in a corresponding storage element of a plurality of storage elements. The method continues by reading an output from each of the plurality of storage elements to test the logic module subsequent to the plurality of clock pulses.

In yet another embodiment, a field programmable gate array (FPGA) includes an input/output section, programmable logic fabric, and memory. The programmable logic fabric is operably coupled to the input/output section. The memory is operably coupled to the programmable logic, wherein the FPGA is tested by: programming at least a portion of the FPGA device in accordance with at least a portion of an application to produce a programmed circuit, wherein the programmed circuit includes an input sequential element and an output sequential element. The testing continues by providing a test input to the programmed circuit. The testing continues by triggering the input sequential element to temporarily store the test input based on a first edge of the test clock. The testing continues by triggering the output sequential element to temporarily store a test output of the programmed circuit based on a second edge of the test clock. The testing continues by capturing the test output of the programmed circuit in accordance with the second edge of the test clock.

In a further embodiment, a field programmable gate array (FPGA) includes an input/output section, programmable logic fabric, and memory. The programmable logic fabric is operably coupled to the input/output section. The memory operably coupled to the programmable logic, wherein the FPGA is tested by providing a test pattern to a logic module of the FPGA for a plurality of clock pulses of a test clock. The testing continues by, for each clock pulse of the plurality of clock pulses, capturing an output of the logic module in a corresponding storage element of a plurality of storage elements. The testing continues by reading an output from each of the plurality of storage elements to test the logic module subsequent to the plurality of clock pulses.

BRIEF DESCRIPTION OF THE SEVERAL VIEWS OF THE DRAWINGS

FIG. 4 is a diagram of another example of a logic module test in accordance with the present invention;

FIG. 7 is a test waveform for the FPGA under test of FIG. 6;

FIG. 8 is another test waveform of the FPGA under test of FIG. 6;

DETAILED DESCRIPTION OF THE INVENTION

Figure 1:
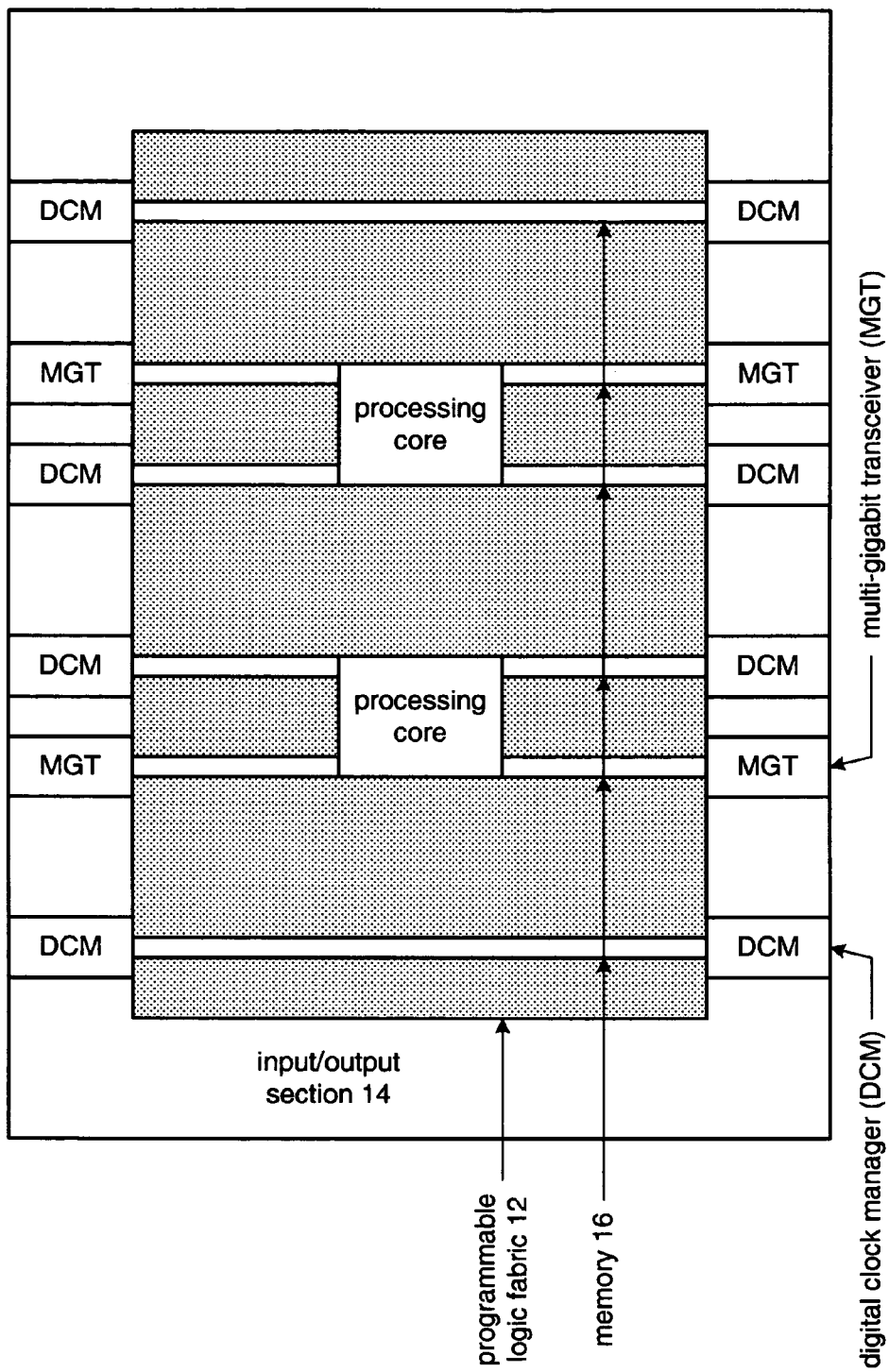
FIG. 1 is a schematic block diagram of a programmable logic device in accordance with the present invention.

FIG. 1 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLA), programmable array logic (PAL) devices, erasable programmable logic devices (EPLD) and/or programmable gate arrays (PGA). The memory 16 may be block random access memory (BRAM). The input/output section 14 may include a plurality of digital clock managers (DCM) and a plurality of multi-gigabit transceivers (MGT).

The digital clock managers (DCM) provide various clock signals to the programmable logic fabric 12 and may further provide clock signals to the multi-gigabit transceivers. In addition, the DCM may provide clock signals to memory, or other input/output modules, for double data rate and quad data rate accesses. The multi-gigabit transceivers, which may include one or more clock circuits, provide digital interfaces for the programmable logic fabric 12 to exchange data with components external to the programmable logic device 10. In general, the multi-gigabit transceivers provide serial to parallel conversion of received serial data and provide parallel to serial conversions for outgoing data.

Figure 2:
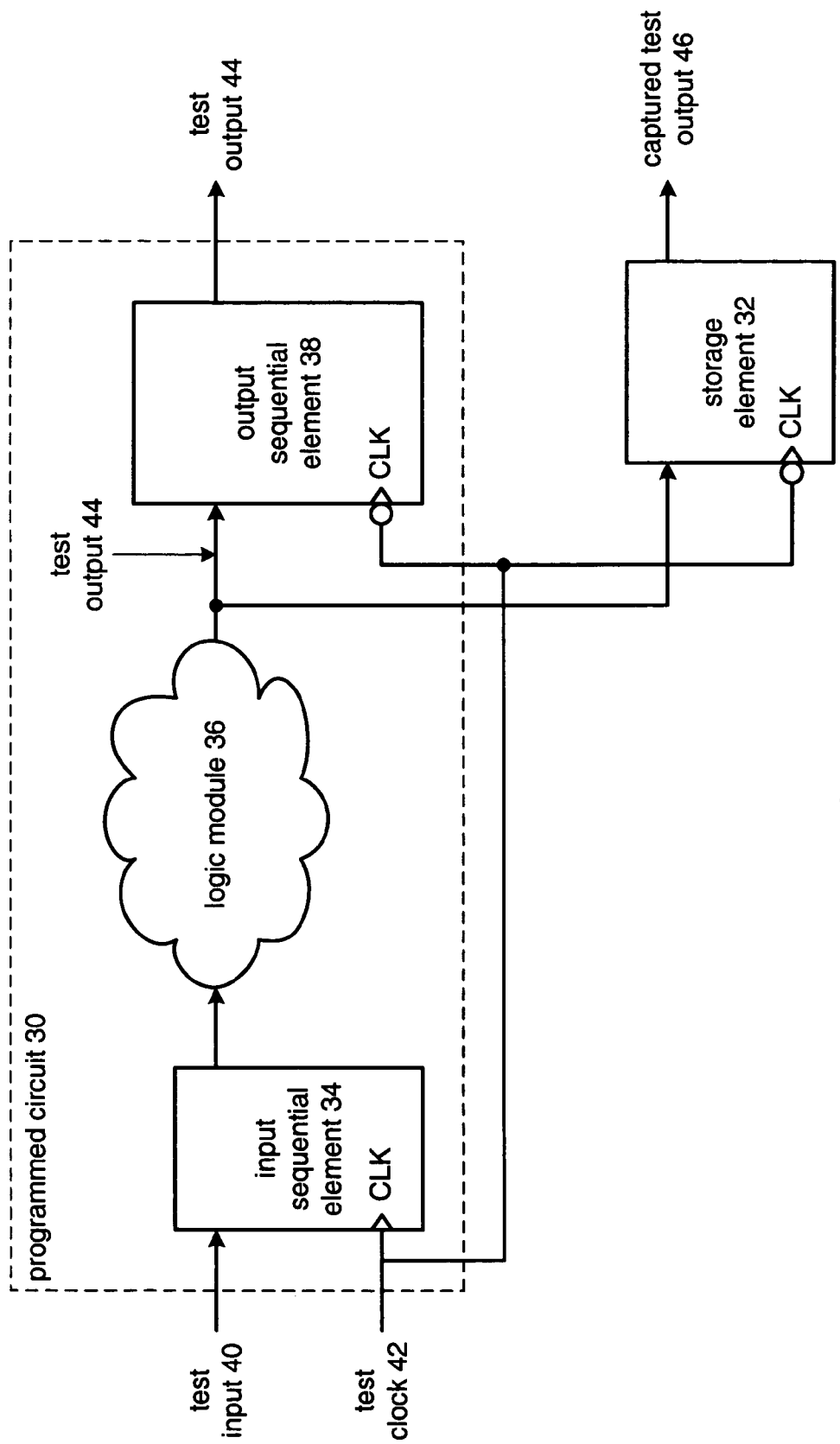
FIG. 2 is a diagram of an FPGA under test in accordance with the present invention.

FIG. 2 is a diagram of a FPGA under test, where a portion of the FPGA is programmed in accordance with a particular application being performed by the FPGA to produce a programmed circuit 30. The program circuit 30 will typically include an input sequential element 34, a logic module 36, and an output sequential element 38. In one embodiment, the input and output sequential elements 34 and 38 may be flip-flops, latches, and/or memory cells. The logic module 36 may be any combination of logic circuits ranging from a single transistor to programmed FPGA blocks. Further note that the logic module 36 may only include the critical elements within a transitional path of a programmed FPGA block.

Storage element 32 is coupled to the programmable circuit 30 for reading back the testing of the programmed circuit 30. In one embodiment, the storage element 32 may be a portion of the FPGA program to store the test results and/or a memory cell on the memory layer of an FPGA.

Under test, a test input 40, which may be a test vector, a series of pulses, et cetera, is provided to the input sequential element 34 in accordance with a test clock 42. The input sequential element 34 latches, or temporarily stores, the test input 40 based on a first edge of the test clock 42. The stored output is provided to the logic module 36 which performs its function upon the temporarily stored value within the input sequential element 34. The output of the logic module 36 is clocked into the output sequential element 38 based on a second edge of test clock 42. In this manner, one clock is used to test the programmed circuit 30 thereby enabling at-speed clocking to detect transition faults of logic module 36.

The storage element 32 reads the output of the logic module 36 in accordance with the second edge of the test clock 42 to produce captured test outputs 46. The captured test outputs are provided to a tester which interprets the test outputs of the logic module for transition faults.

As one of ordinary skill in the art will appreciate, multiple program circuits may be tested simultaneously or sequentially within an FPGA using a construct similar to that of FIG. 2.

Figure 3:
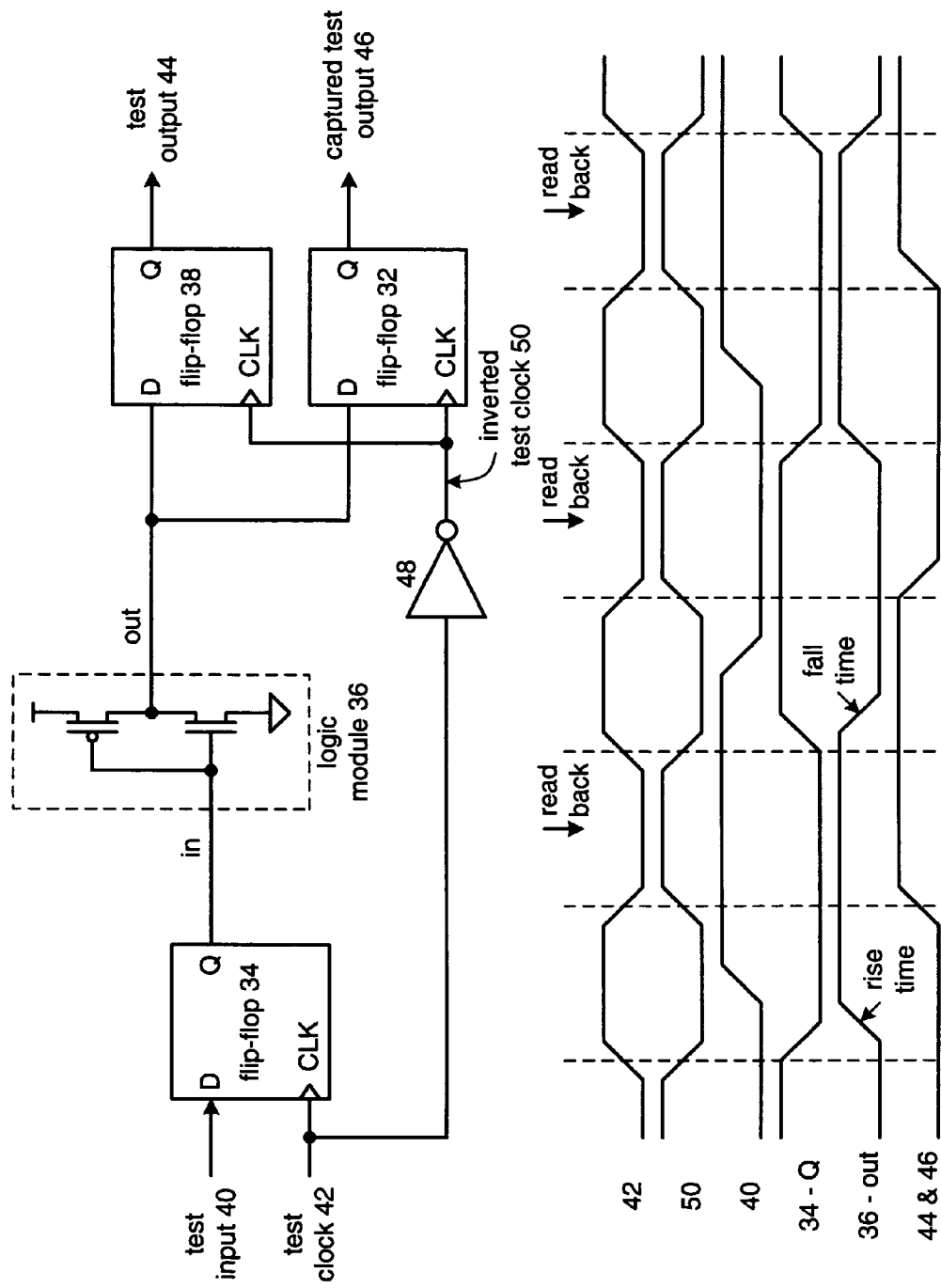
FIG. 3 is a diagram of an example logic module test in accordance with the present invention.

FIG. 3 is a diagram of an example of a logic module 36 under test. In this example, the input and output sequential elements 34 and 38 and the storage element 32 are represented by flip-flops. The logic module 36, in this example, is represented by a two transistor inverter. The corresponding waveforms indicate the operation of the testing of logic module 36. In this example, the test clock 42 has an approximate 50% duty cycle where inverter 48 produces an inverted test clock 50. The waveforms for the test clock 42 and inverted test clock 50 are as shown.

The test input 40 is shown as a digital signal that transitions from logic 0 to logic 1 and back at intervals of the test clock. From these input conditions, flip-flop 34 latches at its "Q" output the state of the input test at the rising edge of test clock 42. As shown in the figure, at the first rising edge of test clock 42, the test input is low. Thus, the "Q" output of flip-flop 34 stores a logic low value for the duration of one period of clock cycle 42.

With the transition of the "Q" output of flip-flop 34 transitioning low, the output of logic module 36 transitions high. The rise time of the output of logic module 36 is one of the focal point of at-speed testing.

Flip-flops 38 and 32 latch the output of logic module 36 on the rising edge of the inverted test clock 50. In this instance, the first rising edge in the test waveforms causes the flip-flops 32 and 38 to latch a logic 1 value. If the rise time for the output of the logic module 36 does not reach a logic 1 value prior to the transition of the inverted test clock 50, the rise time is too slow thus, the logic module 36 would fail the at-speed testing (i.e., have a transition fault). If, as shown, the rise time of the logic module is of a shorter duration than the duration between the rising edges of the test clock and the inverted test clock, the logic module 36 passes the at-speed testing (i.e., does not include a rise time related transition fault).

As shown, read backs by the external tester occur at rates of the test clock at the phase indicated by the read back arrows. As such, the interpretation of the captured test data 46 is read back after the flip-flop 32 has reached a steady state condition and can be done at the rate of the tester.

To test the fall time of logic module 36, the input test signal is transitioned from a logic 1 to a logic 0, which is latched by flip-flop 34 on the next rising edge of test clock 42. This causes the "Q" output of flip-flop 34 to transition from a logic 0 to a logic 1. As the "Q" output of flip-flop 34 transitions from low to high, the logic module 36 transitions from a high to a low.

At the next rising edge of the inverted test clock 50, flip-flops 32 and 38 latch the output of logic module 36. If the fall time is sufficiently fast such that the output of logic module 36 reaches a logic 0 before the next rising edge of the inverted test clock 50, the logic module passes the at-speed test with respect to fall time. If, however, a logic 0 state has not been reached at the next rising edge of the inverted clock 50, the logic module would fail the at-speed test. In general, the logic module 36 passes the at-speed test if the rise time and fall time are of a duration that is less than the timing difference between the rising edge of the test clock and the rising edge of the inverted test clock. For example, if the test clock is 100 MHz 50% duty cycle signal, the rise and fall times must be less than 5 nanoseconds.

FIG. 4 illustrates another example of testing the logic module 36 as an inverter. In this test, the pulse width of the test clock is adjusted via a pulse width adjust module 52. The corresponding waveforms depict the adjusted test clock 54, the inverted adjusted test clock 56, the outputs of flip-flops 34, 38 and 32, and the output of logic module 36.

As can be seen from the waveforms, by narrowing the pulse width of the adjusted test clock 54, the rise and fall times can be tested at much greater speeds than one-half the period of the test clock of FIG. 3. Thus, by narrowing the pulse width, any desired at-speed rate may be used to test logic module 36.

Figure 5:
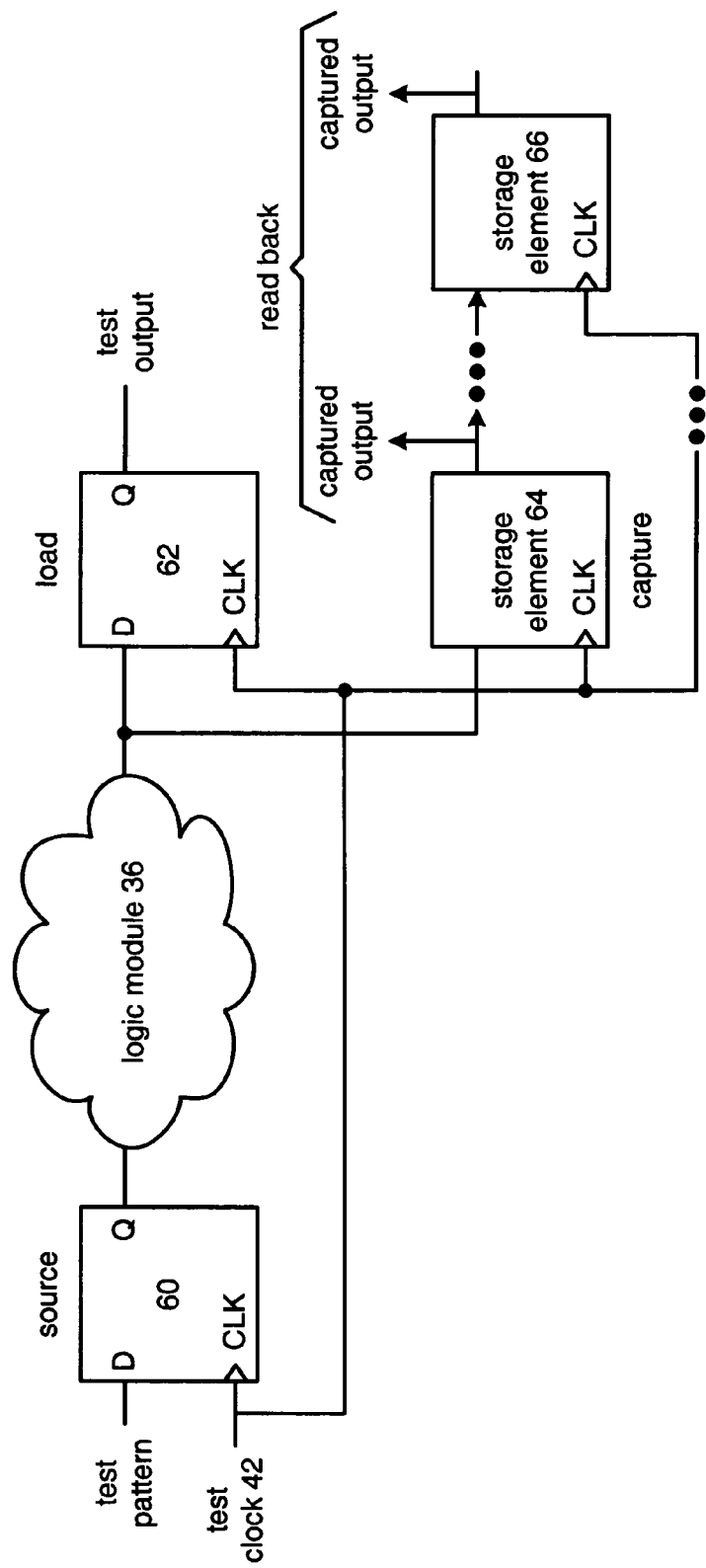
FIG. 5 is another diagram of an FPGA under test in accordance with the present invention.

FIG. 5 is another diagram of an FPGA under test. In this instance, a logic module 36 is coupled to a source flip-flop 60, a load flip-flop 62 and a plurality of storage elements 64-66. Note that only a single storage element may be used to capture and read back the test results. Further note that the storage elements 64 may be flip-flops, latches or memory cells within the memory layer of an FPGA.

In this illustration, the test clock 42 is the clock used by each of the flip-flops 60, 62 and also used by the storage elements 64-66. Such a test implementation takes advantage of the existing FPGA architecture and uses the captured values for multiple at-speed clock cycles. In this way, the last several states of the flip-flops are captured and can be read out after pulses of the at-speed clock. For example, with a 2-bit shift register, the state of the flip-flops before and after the transition is known. Such information is then used to determine if the transition occurred within a specific time requirement.

Figure 6:
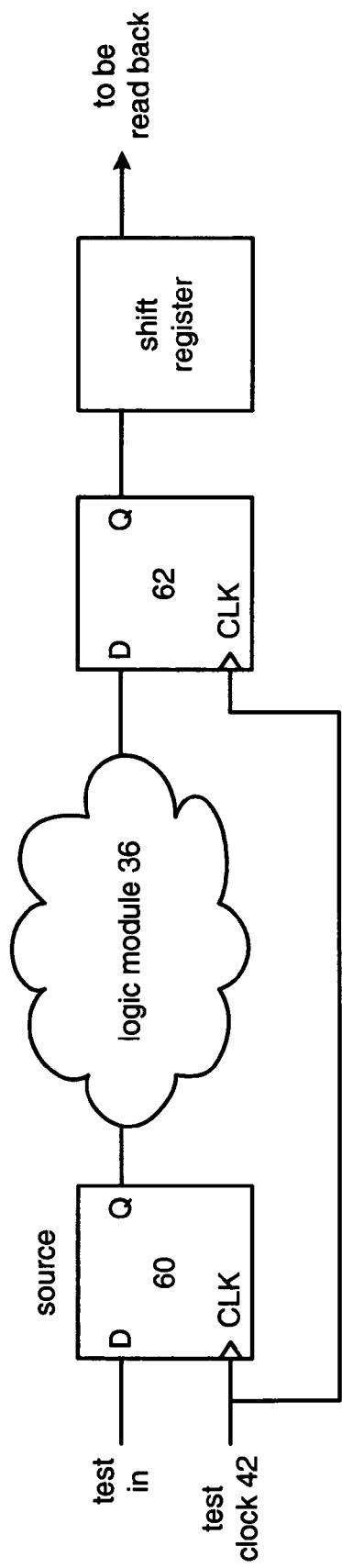
FIG. 6 is a further diagram of an FPGA under test in accordance with the present invention.

FIG. 6 illustrates an alternate embodiment of an FPGA under test. In this instance, a shift register is coupled to the output of the load flip-flop 62. In this manner, the shift register may store the output of load flip-flop 62 for multiple at-speed clock cycles. The stored information may then be read out during a read back cycle to determine if the transitions occurred within the specified time requirement. Accordingly, the larger the shift register, the more diverse testing that may be performed. For example, with a 16-bit shift register, the transition fault testing of a 4 input lookup table can be accomplished with 16 at-speed clock cycles followed by a single read back of the shift register.

FIG. 7 illustrates a test waveform of the FPGA under test diagrams of FIGS. 5 and 6. In this waveform, one cycle is used for launching the data followed by a read back, which is indicated by the arrow and some time later the data is captured and subsequently read back. In this implementation, the speed at which the FPGA can be tested is limited to the speed of the tester providing the test clock. Note that higher speeds may be used by utilizing internal clocks on the FPGA to control the sourcing and loading of the test circuit.

Since read back is a slow process, there is a long delay between clock cycles whenever read back occurs. In other words, during the down time no at-speed testing is performed.

The timing diagram of FIG. 8 improves the test time by running the test sequence twice to enable transition fault testing. While this scheme increases test time, (i.e., the same test period is run two times) to be able to determine transition test faults with a particular architecture it reduces the delays in the read back process. In particular, the first time the test pattern is run, the clock waveform is as shown in FIG. 8. Read back occurs after the source clock has been launched in order to capture the state of the flip-flop before the transition. Thus, the initial value of the flip-flop before the capture clock is known. The second time the test pattern is run, read back occurs after the capture clock. Thus, the value of the flip-flop after the at-speed transition is known. To preserve at-speed testing while still using read back, the test pattern is run twice with different read back points to determine the value in the flip-flop before and after at-speed transitions. This method uses two passes of the same test pattern with different read back points to capture the value and the flip-flops at every clock cycle.

Figure 9:
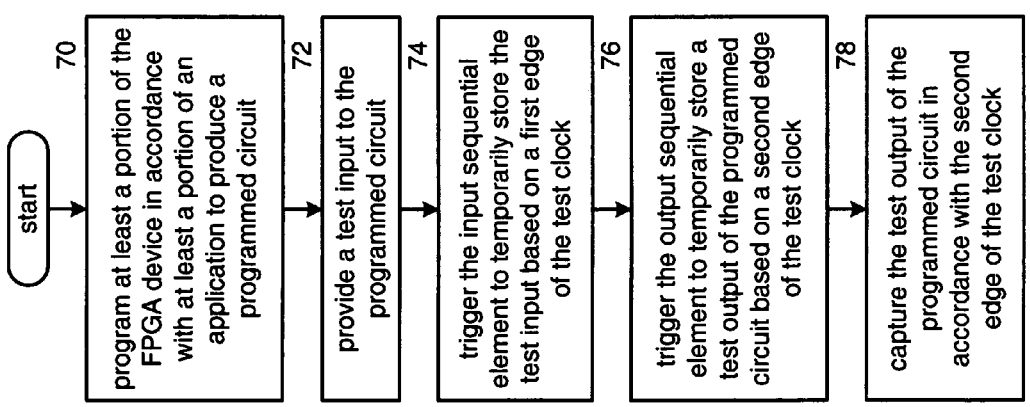
FIG. 9 is a logic diagram of a method for testing a programmable device in accordance with the present invention.

FIG. 9 is a logic diagram of a method for testing a programmable device that begins at Step 70 where at least a portion of the programmable device is programmed in accordance with at least a portion of an application to produce a programmed circuit. The programmed circuit includes an input sequential element and an output sequential element. The input and output sequential elements may be a flip-flop, a latch and/or a memory cell. The application may be a user specified application to which the programmable device will be used in the field, a test application, or any other desired application.

The process then proceeds to Step 72 where a test input is provided to the programmed circuit. The process then proceeds to Step 74 where the input sequential element is triggered to temporarily store the test input based on a first edge of a test clock. The process then proceeds to Step 76 where the output sequential element is triggered to temporarily store a test output of the programmed circuit based on a second edge of the test clock. Note that in one embodiment the pulse width of the test clock may be adjusted to correspond to a desired rate of transition of the programmed circuit to produce the first and second edges of the test clock. Note that the desired rate of transition of the programmed circuit is less than a period of the test clock. In one embodiment, to produce the second edge for triggering the output sequential element, the test clock may be inverted. In yet another embodiment, the inversion of the test clock may be done by programming a portion of the FPGA to produce an inverter.

The process then proceeds to Step 78 where the test output of the programmed circuit is captured in accordance with the second edge of the test clock. The capturing of the output may be done by triggering a storage element based on the second edge of the test clock to temporarily store the test output, which is subsequently read back in accordance with an external tester. In one embodiment, the storage element may be produced by programming the FPGA to provide the storage element, or the storage element may be a memory cell or memory cells on a memory layer of the FPGA. As one of average skill in the art will appreciate, multiple programmed circuits may be tested sequentially or simultaneously in the manner described with reference to FIG. 9.

Figure 10:
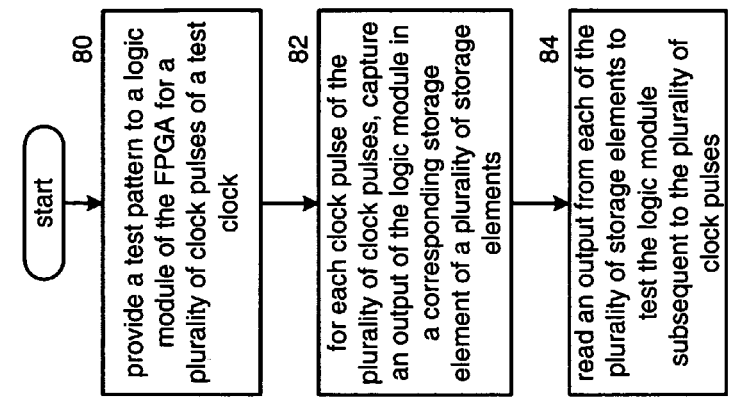
FIG. 10 is a logic diagram of another method for testing a programmable device in accordance with the present invention.

FIG. 10 is a logic diagram of another method for testing a programmable device. The process begins at Step 80 where a test pattern is provided to a logic module of a programmable device for a plurality of clock pulses of a test clock. The test clock may be an external test clock or an internal programmable device clock.

The process then proceeds to Step 82 where for each clock pulse of the plurality of clock pulses, an output of the logic module is captured in a corresponding storage element of a plurality of storage elements. The storage element may be a shift register, memory cells on a memory layer of a programmable device, or programming the programmable device to provide the storage elements.

The process then proceeds to Step 84 where an output from each of the plurality of storage elements is read back to a test module to test the logic module subsequent to the plurality of clock pulses. In one embodiment, the test patterns may be applied for a second time as was described with reference to FIG. 8.

As one of average skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for testing a programmable device. As one of average skill in the art will appreciate, other embodiments may be derived from the teaching of the present invention without deviating from the scope of the claims.

What is claimed is:

1. A method of testing a programmable device, the method comprises:
   programming at least a portion of the programmable device in accordance with at least a portion of an application to produce a programmed circuit, wherein the programmed circuit includes an input sequential element and an output sequential element;
   providing a test input to the programmed circuit;
   triggering the input sequential element to temporarily store the test input based on a first edge of the test clock;
   triggering the output sequential element to temporarily store a test output of the programmed circuit based on a second edge of the test clock;
   capturing the test output of the programmed circuit in accordance with the second edge of the test clock; and
   wherein a pulse width defined by the first and second edges of the test clock is adjusted to determine an amount of time required for a logic transition of the test output to occur.

2. The method of claim 1, wherein each of the input sequential element and output sequential element comprises at least one of:
   a flip flop;
   a latch;
   a memory cell.

3. The method of claim 1, wherein capturing the test output comprises:
   triggering a storage element based on the second edge of the test clock to temporarily store the test output.

4. The method of claim 3 comprises:
   programming a second portion of the programmable device to provide the storage element.

5. The method of claim 1 further comprises:
   programming a second portion of the programmable device to produce a second programmed circuit, wherein the second programmed circuit includes a second input sequential element and a second output sequential element;

providing a second test input to the second programmed circuit;

triggering the second input sequential element to temporarily store the second test input based on the first edge of the test clock;

triggering the second output sequential element to temporarily store a second test output of the second programmed circuit based on the second edge of the test clock; and capturing the second test output of the programmed circuit in accordance with the second edge of the test clock.

6. The method of claim 5 comprises:

concurrently providing the test input to the programmed circuit with the providing the second test input to the second programmed circuit.

7. The method of claim 1, wherein triggering the output sequential element comprises:

generating an inversion of the test clock to produce the second edge of the test clock.

8. The method of claim 7, wherein generating the inversion of the test clock comprises:

programming a second portion of the programmable device to produce an inverter operably coupled to invert the clock input.

9. A field programmable gate array (FPGA) comprises:

an input/output section;

programmable logic fabric operably coupled to the input/output section; and memory operably coupled to the programmable logic, wherein the FPGA is tested by:

programming at least a portion of the FPGA device in accordance with at least a portion of an application to produce a programmed circuit, wherein the programmed circuit includes an input sequential element and an output sequential element;

providing a test input to the programmed circuit;

triggering the input sequential element to temporarily store the test input based on a first edge of the test clock;

triggering the output sequential element to temporarily store a test output of the programmed circuit based on a second edge of the test clock;

capturing the test output of the programmed circuit in accordance with the second edge of the test clock; and wherein a pulse width defined by the first and second edges of the test clock is adjusted to determine an amount of time required for a logic transition of the test output to occur.

10. The FPGA of claim 9, wherein each of the input sequential element and output sequential element comprises at least one of:

a flip flop;

a latch;

a memory cell.

11. The FPGA of claim 9, wherein capturing the test output comprises:

triggering a storage element of the memory based on the second edge of the test clock to temporarily store the test output.

12. The FPGA of claim 9, wherein capturing the test output comprises:

programming a second portion of the FPGA to provide a storage element; and triggering the storage element based on the second edge of the test clock to temporarily store the test output.

13. The FPGA of claim 9, wherein testing of the FPGA further comprises:

programming a second portion of the FPGA device to produce a second programmed circuit, wherein the second programmed circuit includes a second input sequential element and a second output sequential element;

providing a second test input to the second programmed circuit;

triggering the second input sequential element to temporarily store the second test input based on the first edge of the test clock;

triggering the second output sequential element to temporarily store a second test output of the second programmed circuit based on the second edge of the test clock; and capturing the second test output of the programmed circuit in accordance with the second edge of the test clock.

14. The FPGA of claim 13, wherein testing of the FPGA comprises:

concurrently providing the test input to the programmed circuit with the providing the second test input to the second programmed circuit.

15. The FPGA of claim 9, wherein triggering the output sequential element comprises:

generating an inversion of the test clock to produce the second edge of the test clock.

16. The FGPA of claim 15, wherein generating the inversion of the test clock comprises:

programming a second portion of the FPGA to produce an inverter operably coupled to invert the clock input.

* * * * *